(12) United States Patent
Moon et al.

(10) Patent No.: US 11,009,751 B2
(45) Date of Patent: May 18, 2021

(54) DISPLAY DEVICE AND METHOD OF FABRICATING THE SAME

(71) Applicant: Samsung Display Co., Ltd., Yongin-si (KR)

(72) Inventors: Kyungha Moon, Seoul (KR); Siwon Hwang, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 127 days.

(21) Appl. No.: 15/952,084

(22) Filed: Apr. 12, 2018

(65) Prior Publication Data

US 2019/0025628 A1 Jan. 24, 2019

(30) Foreign Application Priority Data

Jul. 24, 2017 (KR) .......................... 10-2017-0093761

(51) Int. Cl.
*G02F 1/1339* (2006.01)
*H01L 27/12* (2006.01)

(52) U.S. Cl.
CPC ...... *G02F 1/13394* (2013.01); *H01L 27/1218* (2013.01); *G02F 1/13398* (2021.01)

(58) Field of Classification Search
CPC ....... G02F 1/13394; G02F 2001/13398; G02F 1/13398
See application file for complete search history.

(56) References Cited

U.S. PATENT DOCUMENTS

| 7,701,544 | B2 * | 4/2010 | Yang .................... G02F 1/13394 |
| | | | 349/155 |
| 8,237,907 | B2 | 8/2012 | Kim et al. |
| 8,248,571 | B2 | 8/2012 | Park |
| 8,253,916 | B2 | 8/2012 | Park et al. |
| 8,383,191 | B2 | 2/2013 | Yoon |
| 8,384,859 | B2 | 2/2013 | Cho et al. |
| 8,477,282 | B2 | 7/2013 | Shim |
| 8,514,355 | B2 | 8/2013 | Woo et al. |
| 8,724,073 | B2 | 5/2014 | Woo et al. |
| 9,134,566 | B2 | 9/2015 | Cho et al. |
| 9,164,324 | B2 | 10/2015 | Son et al. |
| 9,546,308 | B2 | 1/2017 | Pesika et al. |

(Continued)

FOREIGN PATENT DOCUMENTS

| JP | 2001-133790 A | 5/2001 |
| JP | 2013-109124 | 6/2013 |

(Continued)

*Primary Examiner* — Paisley L Wilson
(74) *Attorney, Agent, or Firm* — Lewis Roca Rothgerber Christie LLP

(57) ABSTRACT

A display device includes a first substrate, a second substrate opposite to the first substrate, a liquid crystal layer between the first substrate and the second substrate, and a plurality of spacers maintaining a cell gap between the first substrate and the second substrate. Each of the plurality of spacers includes a spacer body portion protruding from the first substrate, and a spacer pattern portion including a plurality of pillar portions protruding from the spacer body portion and a plurality of contact portions respectively on top ends of the plurality of pillar portions so as to be in contact with a bottom surface of the second substrate.

15 Claims, 17 Drawing Sheets

(56) References Cited

U.S. PATENT DOCUMENTS

| | | | |
|---|---|---|---|
| 2011/0228190 A1* | 9/2011 | Yang | G02F 1/13394 |
| | | | 349/56 |
| 2012/0086901 A1* | 4/2012 | Nakagawa | G02F 1/13394 |
| | | | 349/155 |
| 2013/0126875 A1 | 5/2013 | Ishikawa et al. | |
| 2016/0370628 A1* | 12/2016 | Zhe | G02F 1/13394 |
| 2019/0114001 A1* | 4/2019 | Mugiraneza | G06F 3/0412 |

FOREIGN PATENT DOCUMENTS

| | | |
|---|---|---|
| KR | 10-2007-0097885 | 10/2007 |
| KR | 10-2012-0025731 A | 3/2012 |
| KR | 10-1201318 | 11/2012 |
| KR | 10-1481833 B1 | 1/2015 |
| KR | 10-2017-0045125 | 4/2017 |

\* cited by examiner

DISPLAY DEVICE AND METHOD OF FABRICATING THE SAME

CROSS-REFERENCE TO RELATED APPLICATION

This application claims priority to and the benefit of Korean Patent Application No. 10-2017-0093761, filed on Jul. 24, 2017 in the Korean Intellectual Property Office, the entire content of which is herein incorporated by reference.

BACKGROUND

1. Field

Aspects of embodiments of the present invention relate to a display device and a method of fabricating the same.

2. Description of the Related Art

Display devices having various shapes have recently been developed subsequent to conventional flat-type display devices. For example, bent, foldable, rollable, and flexible display devices have been developed. These display devices may have predetermined shapes or the shapes of these display devices may be variously modified according to user needs. Thus, the display devices may provide image information to users in various ways.

SUMMARY

According to aspects of embodiments of the present invention, a display device is capable of reducing or preventing misalignment of a substrate which may be caused when the display device is bent, and a method of fabricating the same is provided.

According to an aspect of embodiments of the present invention, a display device is capable of improving display quality by preventing or reducing misalignment between an upper substrate and a lower substrate in a curved structure.

According to another aspect of embodiments of the present invention, a method of fabricating a display device is provided, which is capable of simplifying fabricating processes and of reducing a fabrication cost.

According to an aspect of one or more embodiments of the present invention, a display device includes a first substrate, a second substrate opposite to the first substrate, a liquid crystal layer between the first substrate and the second substrate, and a plurality of spacers maintaining a cell gap between the first substrate and the second substrate. Each of the plurality of spacers includes a spacer body portion protruding from the first substrate, and a spacer pattern portion including a plurality of pillar portions protruding from the spacer body portion and a plurality of contact portions respectively on top ends of the plurality of pillar portions so as to be in contact with a bottom surface of the second substrate.

Each of the plurality of contact portions may include a contact surface defined at an outermost end of the spacer to adhere to the bottom surface of the second substrate.

The contact surface may be recessed from the outermost end of the spacer toward the spacer body portion.

The contact surface may be parallel to a top surface of the spacer body portion and may be flat.

An area of the contact surface may be greater than a cross-sectional area of a cross-section, which is parallel to a top surface of the spacer body portion, of the pillar portion.

A diameter of each of the contact portions may become progressively greater from the pillar portion toward a top end of each of the contact portions.

The spacer may include a material capable of elastic deformation.

The spacer may include a silicon-based polymer compound.

The spacer may include polydimethylsiloxane (PDMS).

The first substrate and the second substrate may be curved along a direction.

According to an aspect of one or more embodiments of the present invention, a display device includes a display substrate which is curved along a direction and on which a pixel is arranged, an opposite substrate that is opposite to the display substrate and is coupled to the display substrate so as to be curved along the direction, and a plurality of spacers maintaining a distance between the display substrate and the opposite substrate. Each of the plurality of spacers includes a spacer body portion protruding from the display substrate, a plurality of pillar portions protruding from the spacer body portion, and a plurality of contact portions on top ends of the plurality of pillar portions, respectively.

According to an aspect of one or more embodiments of the present invention, a method of fabricating a display device includes preparing a first substrate including a pixel and a second substrate opposite to the first substrate, forming an organic material layer on the first substrate, forming a plurality of spacers by patterning the organic material layer, and coupling the first substrate and the second substrate to each other with the plurality of spacers interposed therebetween such that the first substrate and the second substrate face each other. The forming of the plurality of spacers includes patterning the organic material layer to form a spacer body portion protruding from the first substrate, and patterning an upper portion of the spacer body portion to form a plurality of pillar portions protruding from the spacer body portion and a plurality of contact portions respectively on top ends of the plurality of pillar portions.

The organic material layer may include a silicon-based polymer compound.

The organic material layer may include polydimethylsiloxane (PDMS).

The forming of the plurality of spacers may include pressing the organic material layer using a first mold in which a first recess corresponding to a shape of the spacer body portion is defined, partially hardening the pressed organic material layer to form the spacer body portion, pressing the upper portion of the spacer body portion using a second mold in which a second recess corresponding to shapes of the plurality of pillar portions and the plurality of contact portions is defined, and hardening the pressed upper portion of the spacer body portion to form the plurality of pillar portions and the plurality of contact portions.

The method may further include curving the first substrate and the second substrate along a direction by applying an external force to the first substrate and the second substrate.

BRIEF DESCRIPTION OF THE DRAWINGS

The above and other aspects and features of the present invention will become more apparent by describing in further detail some exemplary embodiments thereof with reference to the accompanying drawings, in which.

DETAILED DESCRIPTION

Figure 1A:
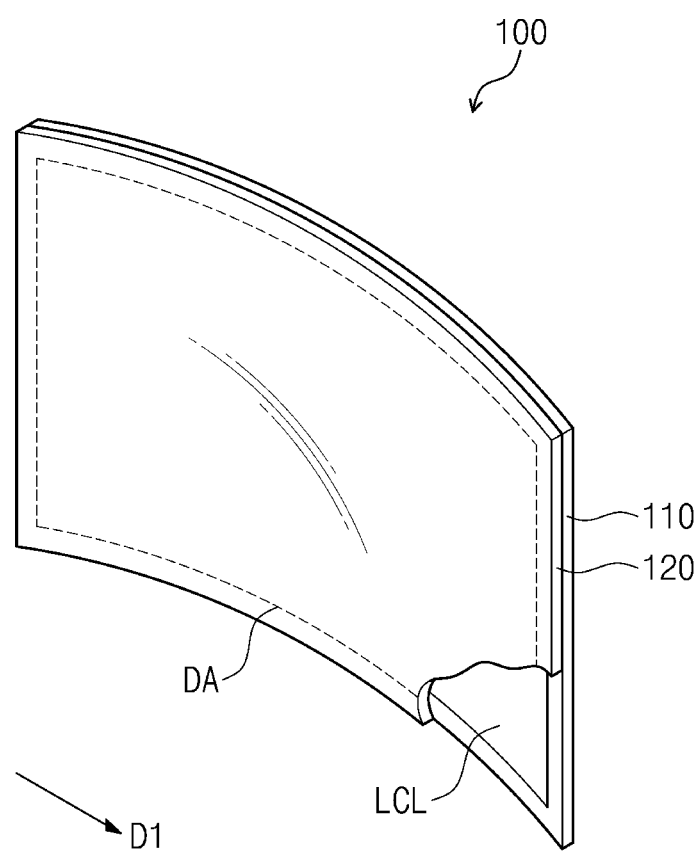
FIG. 1A is a perspective view illustrating a display device according to an embodiment of the invention.

The invention will be described more fully herein with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It is to be understood that when an element, such as a layer, region, or substrate is referred to as being "on" another element, it can be directly on the other element or one or more intervening elements may be present. In contrast, the term "directly" means that there are no intervening elements. As used herein, the term "and/or" includes any and all combinations of one or more of the associated listed items. The terminology used herein is for the purpose of describing particular embodiments and is not intended to be limiting. As used herein, the singular forms "a," "an," and "the" are intended to include the plural forms, including "at least one," unless the context clearly indicates otherwise. "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

It is to be understood that, although the terms "first," "second," etc. may be used herein to describe various elements, components, regions, layers, and/or sections, these elements, components, regions, layers, and/or sections are not to be limited by these terms. Rather, these terms are used to distinguish one element, component, region, layer, or section from another element, component, region, layer, or section. Thus, a "first" element, component, region, layer, or section discussed below could be termed a "second" element, component, region, layer, or section without departing from the teachings herein. "About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system).

Exemplary embodiments are described herein with reference to cross-sectional illustrations and/or plane illustrations that may be idealized exemplary illustrations. In the drawings, the thicknesses of layers and regions may be exaggerated for clarity. Accordingly, variations from the shapes of the illustrations as a result, for example, of manufacturing techniques and/or tolerances, may be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures may be schematic in nature and their shapes not intended to illustrate the actual shape of a region of a device, and are not intended to limit the scope of the embodiments.

Herein, some exemplary embodiments of the present invention will be described in further detail with reference to the accompanying drawings.

Figure 1B:
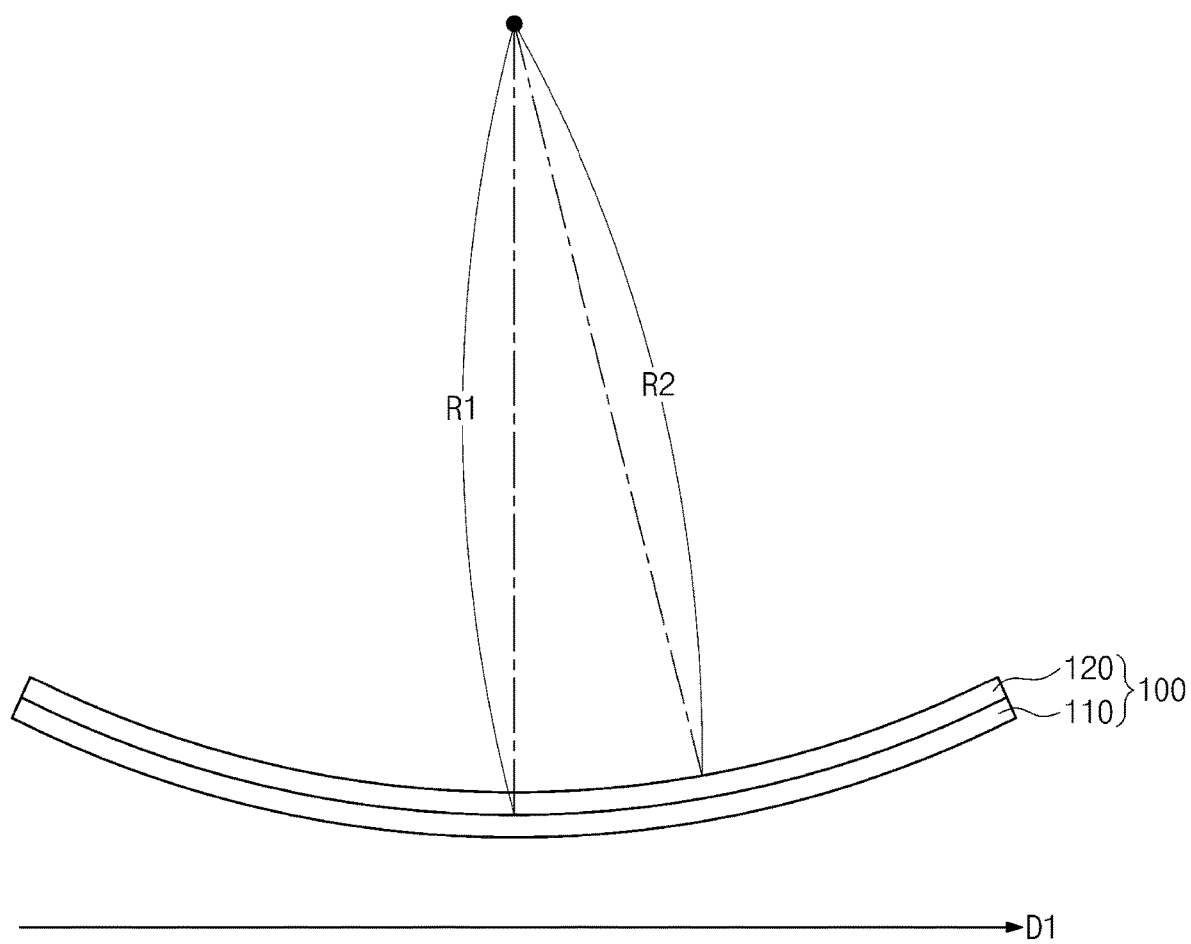
FIG. 1B is a side view illustrating a display device according to an embodiment of the invention.

FIG. 1A is a perspective view illustrating a display device according to an embodiment of the invention. FIG. 1B is a side view illustrating a display device according to an embodiment of the invention.

Referring to FIGS. 1A and 1B, a display device 100 has a display area DA in which an image is displayed. The display device 100 has a curved shape. Thus, the display device 100 may display an image having improved three-dimensional effect, sense of immersion (or immersiveness) and presence by using the display area DA having a curved surface shape.

The display device 100 may include a first substrate 110, a second substrate 120, and a liquid crystal layer LCL. The second substrate 120 faces the first substrate 110 and is coupled to the first substrate 110. The liquid crystal layer LCL is disposed between the first substrate 110 and the second substrate 120. The first substrate 110 may be a display substrate on which pixels are disposed, and the second substrate 120 may be an opposite substrate opposite to the first substrate 110.

The display device 100 may further include one or more other components in addition to the first substrate 110, the second substrate 120, and the liquid crystal layer LCL.

However, embodiments of the invention are not limited to the other component(s). For example, the display device 100 may further include a backlight assembly (not shown) outputting light to the first and second substrates 110 and 120. However, embodiments of the invention are not limited to a structure of the backlight assembly.

The display device 100 is curved along a first direction D1 when viewed in a plan view. Thus, a portion or an entirety of the first substrate 110 may have a shape curved along the first direction D1, and the display area DA may have a surface shape curved along the first direction D1. In addition, the second substrate 120 may have a curved shape together with the first substrate 110.

When the first and second substrates 110 and 120 are curved together along the first direction D1, the first substrate 110 may have a first radius R1 of curvature and the second substrate 120 may have a second radius R2 of curvature different from the first radius R1 of curvature. Since the first substrate 110 and the second substrate 120 are curved with the radii of curvature different from each other, stress may be locally concentrated on the first substrate 110 and the second substrate 120. Thus, an area in which a cell gap is non-uniform may occur between the first substrate 110 and the second substrate 120, and misalignment between the first and second substrates 110 and 120 may occur. In other words, even though the first and second substrates 110 and 120 may be accurately aligned with each other before the first and second substrates 110 and 120 are curved along the first direction D1, the misalignment may be caused by the difference in radius of curvature which occurs when the first and second substrates 110 and 120 are curved along the first direction D1. A structure of the display device 100 capable of preventing or substantially preventing deterioration of display quality of an image which is caused in the display area DA by the misalignment will be described herein.

Figure 2:
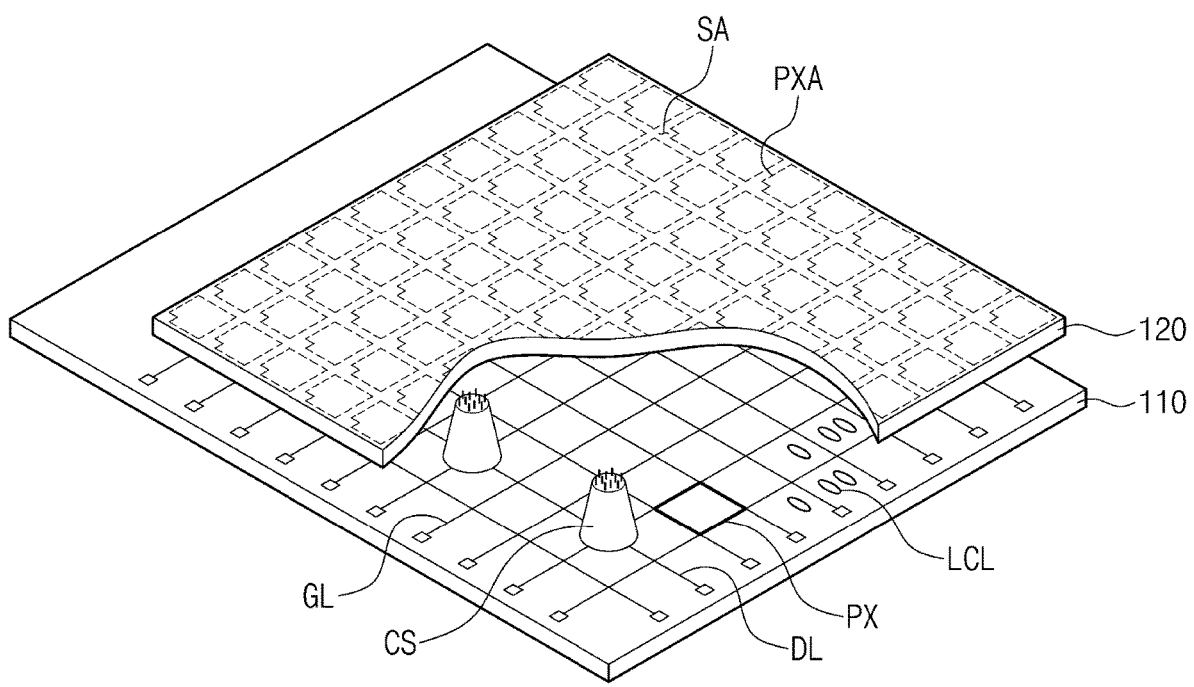
FIG. 2 is a perspective view schematically illustrating a structure of a display device according to an embodiment of the invention.
Figure 3:
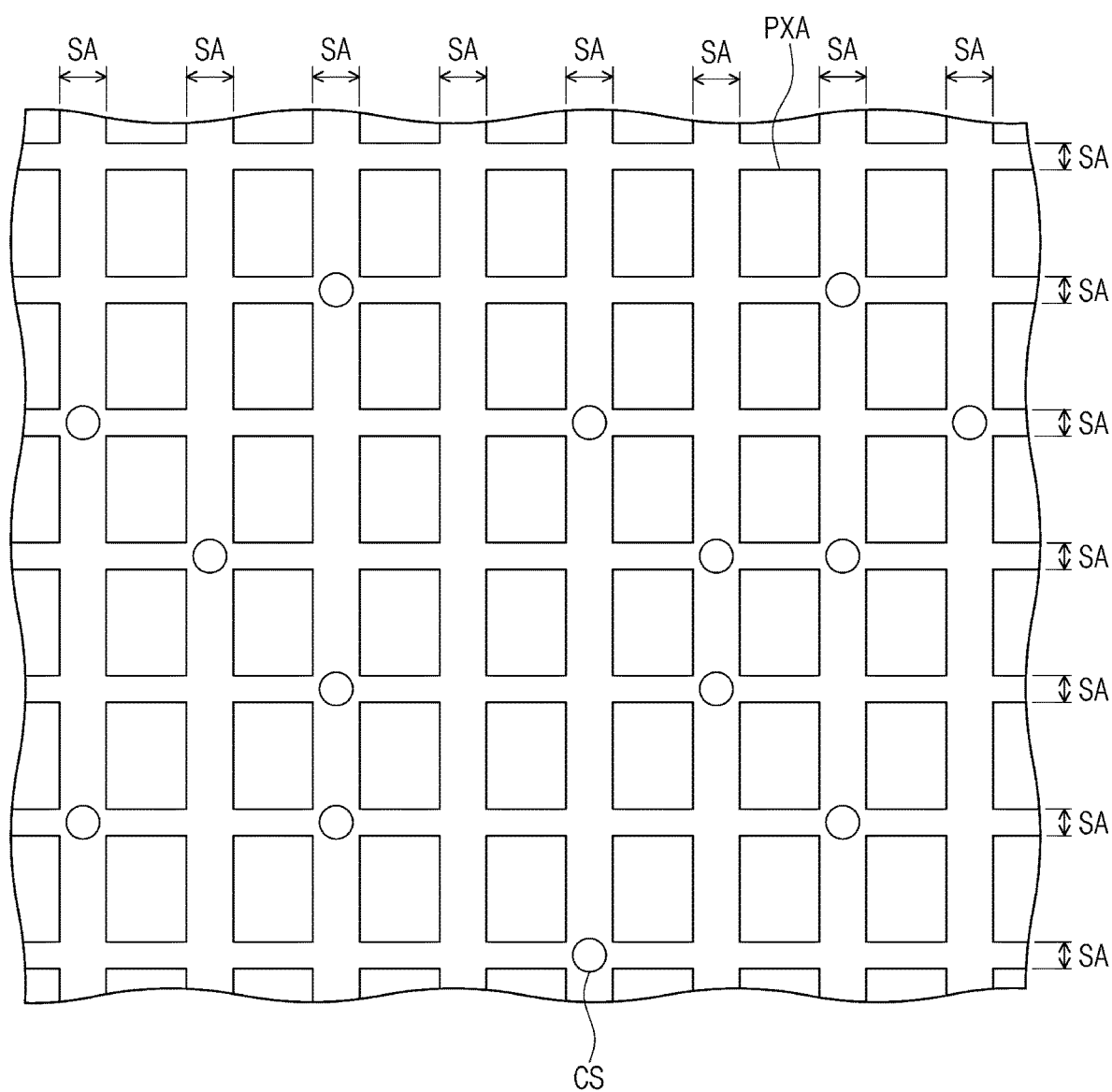
FIG. 3 is a partial plan view illustrating a display device according to an embodiment of the invention.

FIG. 2 is a perspective view schematically illustrating a structure of a display device according to an embodiment of the invention. FIG. 3 is a partial plan view of the display device illustrated in FIG. 2. Herein, the display device according to the present embodiment will be described with reference to FIGS. 2 and 3.

The display device according to the present embodiment includes a first substrate 110, a second substrate 120 facing the first substrate 110, a liquid crystal layer LCL disposed between the first substrate 110 and the second substrate 120, and a plurality of spacers CS disposed between the first substrate 110 and the second substrate 120. The display device may include a plurality of pixel areas PXA and a peripheral area SA adjacent to the plurality of pixel areas PXA when viewed in a plan view. The peripheral area SA may form a boundary between the plurality of pixel areas PXA.

The first substrate 110 may include a first base substrate, a plurality of insulating layers, and a plurality of conductive layers. The plurality of insulating layers and the plurality of conductive layers may be disposed on the first base substrate. The plurality of conductive layers may constitute a plurality of signal lines and a plurality of pixels PX. The plurality of signal lines may overlap with the peripheral area SA in a plan view, and the plurality of pixels PX may overlap with the plurality of pixel areas PXA in a plan view. In an embodiment, the plurality of insulating layers may be formed by a coating process and/or a deposition process.

The plurality of signal lines may include a plurality of gate lines GL and a plurality of data lines DL insulated from and intersecting the plurality of gate lines GL. The plurality of gate lines GL may receive gate signals, and the plurality of data lines DL may receive data voltages. The plurality of pixels PX may be respectively connected to corresponding ones of the gate lines GL and may be respectively connected to corresponding ones of the data lines DL. Although not shown in the drawings, each of the pixels PX may include a thin film transistor connected to the corresponding gate line and the corresponding data line and a capacitor connected to the thin film transistor.

The second substrate 120 may include a second base substrate and a plurality of insulating layers.

The spacer CS maintains a cell gap between the first substrate 110 and the second substrate 120. In an embodiment of the invention, the spacer CS may protrude from the first substrate 110. However, embodiments of the invention are not limited thereto. In another embodiment, the spacer CS may protrude from the second substrate 120. Alternatively, the spacer CS may include two sub-spacers that protrude from the first and second substrates 110 and 120, respectively, and are in contact with each other.

As illustrated in FIG. 3, the spacer CS may be disposed to overlap with the peripheral area SA. As described above, the spacer CS may be provided in plurality. In an embodiment, the plurality of spacers CS may be arranged at equal distances. In another embodiment, the plurality of spacers CS may be randomly arranged. An appropriate number of the spacers CS capable of maintaining the cell gap may be disposed between the first substrate 110 and the second substrate 120. For example, one spacer CS may be disposed for every three pixels.

Figure 4:
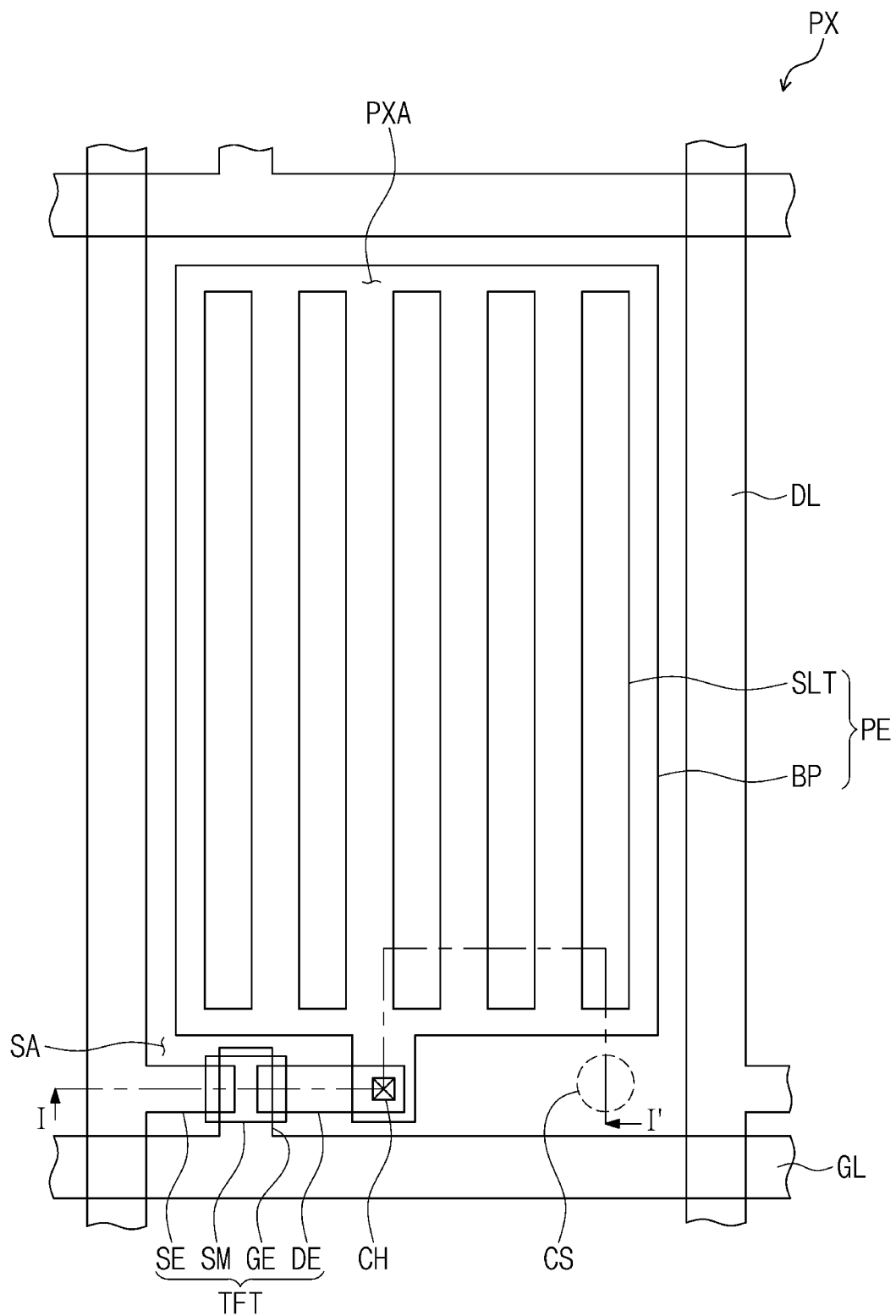
FIG. 4 is a plan view schematically illustrating a pixel area according to an embodiment of the invention.
Figure 5:
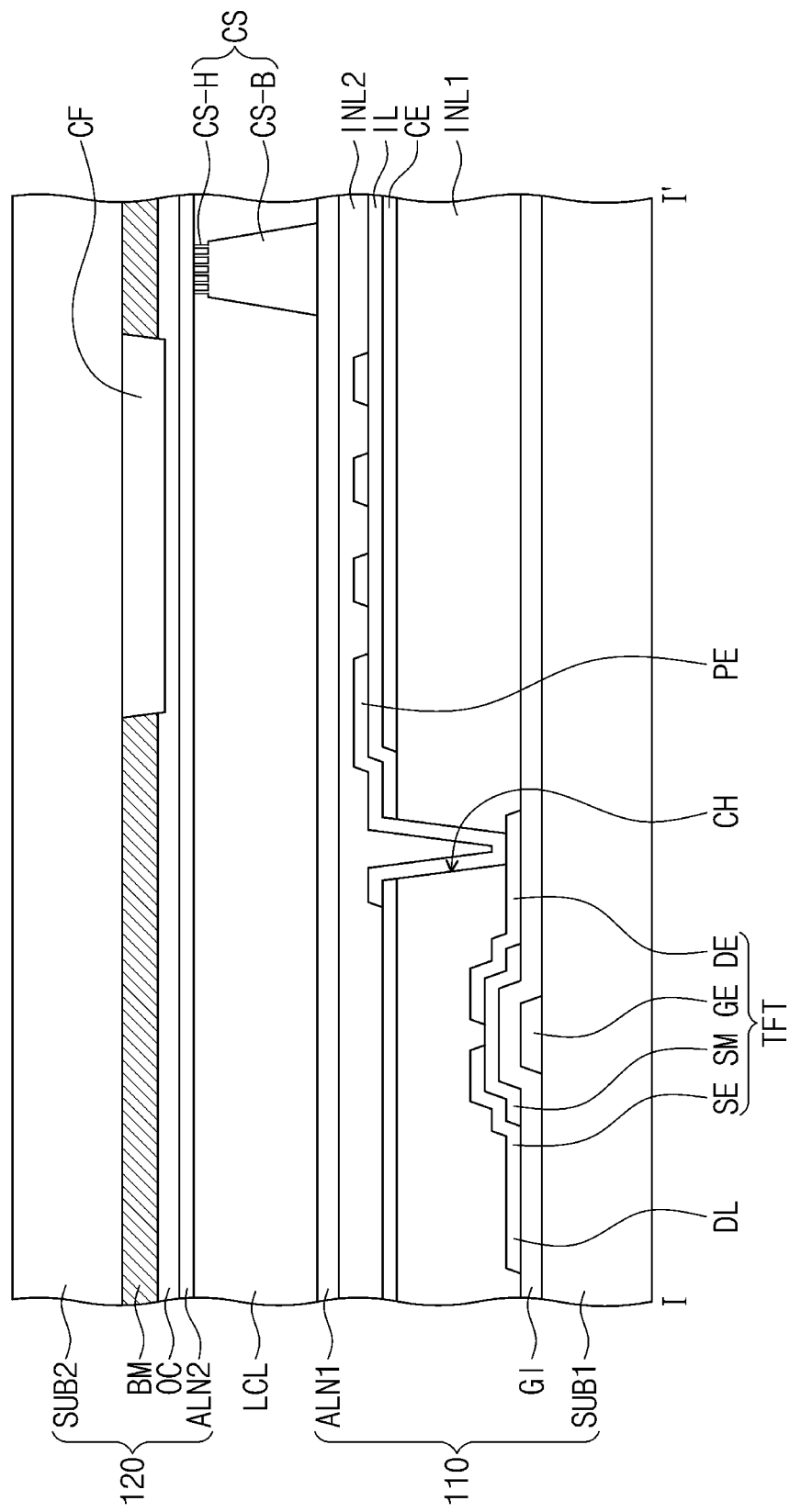
FIG. 5 is a cross-sectional view taken along a line I-I' of FIG. 4.

FIG. 4 is a plan view schematically illustrating a pixel area according to an embodiment of the invention. FIG. 5 is a cross-sectional view taken along a line I-I' of FIG. 4. Herein, a pixel according to an embodiment of the invention will be described with reference to FIGS. 4 and 5.

In the present embodiment, a plane-to-line switching (PLS) mode pixel is illustrated as an example. However, embodiments of the invention are not limited thereto. In other embodiments, for example, the display device may include a vertical alignment (VA) mode pixel, a patterned vertical alignment (PVA) mode pixel, an in-plane switching (IPS) mode pixel, or a fringe-field switching (FFS) mode pixel.

Referring to FIGS. 4 and 5, a display device includes a first substrate 110, a second substrate 120 opposite to the first substrate 110, a liquid crystal layer LCL, and a spacer CS. The liquid crystal layer LCL and the spacer CS are disposed between the first substrate 110 and the second substrate 120.

In an embodiment, the first substrate 110 includes a first base substrate SUB1, a thin film transistor TFT, a pixel electrode PE, and a common electrode CE.

In an embodiment, the first base substrate SUB1 may be a plastic substrate, a glass substrate, or a quartz substrate. The first base substrate SUB1 may be a transparent insulating substrate.

A gate line GL and a data line DL may be formed on the first base substrate SUB1. The gate line GL may be provided in plurality, and the plurality of gate lines GL may extend in a direction on the first base substrate SUB1. The data line DL may be provided in plurality, and the plurality of data lines DL may extend in a direction intersecting the direction in which the gate lines GL extend. A gate insulating layer GI may be disposed between the plurality of data lines DL and the plurality of gate lines GL.

The thin film transistor TFT includes a gate electrode GE, a semiconductor pattern SM, a source electrode SE, and a drain electrode DE.

The gate electrode GE may be branched from the gate line GL or may be provided on a predetermined area of the gate line GL. The gate electrode GE may include a metal. In some embodiments, the gate electrode GE may be formed of a plurality of layers. For example, the gate electrode GE may be formed of at least one of nickel, chromium, molybdenum, aluminum, titanium, copper, tungsten, or an alloy thereof.

The gate insulating layer GI is formed on the gate electrode GE. In an embodiment, the gate insulating layer GI is provided on an entire portion of a top surface of the first base substrate SUB1 and covers the gate line GL and the gate electrode GE.

The semiconductor pattern SM is provided on the gate insulating layer GI. The semiconductor pattern SM is provided on the gate electrode GE with the gate insulating layer GI interposed therebetween, and a portion of the semiconductor pattern SM overlaps with the gate electrode GE.

The source electrode SE is branched from the data line DL. A portion of the source electrode SE overlaps with the gate electrode GE.

The drain electrode DE is spaced apart from the source electrode SE with a portion of the semiconductor pattern SM interposed therebetween when viewed in a plan view. A portion of the drain electrode DE overlaps with the gate electrode GE.

Each of the source electrode SE and the drain electrode DE may be formed of a plurality of layers. For example, the source electrode SE and the drain electrode DE may be formed of at least one of nickel, chromium, molybdenum, aluminum, titanium, copper, tungsten, or an alloy thereof.

The common electrode CE and the pixel electrode PE form an electric field to drive the liquid crystal layer LCL.

The common electrode CE may be formed on a first insulating layer INL1 that covers the thin film transistor TFT, the gate and data lines GL and DL, and the first base substrate SUB1. In an embodiment, the first insulating layer INL1 may include a plurality of layers that may include an organic layer and/or an inorganic layer.

The common electrode CE may be formed of a transparent conductive material. For example, the common electrode CE may be formed of a conductive metal oxide, such as indium tin oxide (ITO), indium zinc oxide (IZO), or indium tin zinc oxide (ITZO). The common electrode CE may be formed by any of various methods. For example, the common electrode CE may be formed using a photolithography process. In an embodiment, an insulating layer IL may be disposed on the common electrode CE and the first insulating layer INL1, and the pixel electrode PE may be disposed on the insulating layer IL. In the display device according to an embodiment of the invention, the pixel electrode PE may be formed on the common electrode CE. Alternatively, the pixel electrode PE may be formed under the common electrode CE.

The pixel electrode PE is connected to the drain electrode DE through a contact hole CH defined in the first insulating layer INL1 and the insulating layer IL.

In an embodiment, the pixel electrode PE may include a plurality of slits SLT and a plurality of branch portions BP which are alternately arranged.

A second insulating layer INL2 may be formed on the pixel electrode PE and the insulating layer IL. In an embodiment, the second insulating layer INL2 may include a plurality of layers that may include an organic layer and/or an inorganic layer. The second insulating layer INL2 may protect the pixel electrode PE, the common electrode CE, and the thin film transistor TFT and may provide a substantially flat top surface on the first base substrate SUB1 on which the thin film transistor TFT is disposed.

The pixel electrode PE may be formed of a transparent conductive material. In an embodiment, the pixel electrode PE may be formed of a transparent conductive oxide. For example, the pixel electrode PE may be formed of indium tin oxide (ITO), indium zinc oxide (IZO), or indium tin zinc oxide (ITZO). The pixel electrode PE may be formed by any of various methods. For example, the pixel electrode PE may be formed using a photolithography process.

Although not shown in the drawings, a protective layer protecting the pixel electrode PE may further be disposed on the second insulating layer INL2. A first alignment layer ALN1 may be formed on the protective layer or the second insulating layer INL2. For example, the first alignment layer ALN1 may be provided to pre-tilt liquid crystal molecules of the liquid crystal layer LCL.

The first alignment layer ALN1 may be formed of a single alignment layer or may include a base alignment layer and an alignment formation layer.

In an embodiment, the second substrate 120 may include a second base substrate SUB2, a black matrix BM, and a color filter CF. However, embodiments of the invention are not limited thereto. In another embodiment, the black matrix BM and the color filter CF may be included in the first substrate 110.

In an embodiment, the second base substrate SUB2 may be a plastic substrate, a glass substrate, or a quartz substrate. The second base substrate SUB2 may be a transparent insulating substrate.

In an embodiment, the black matrix BM is disposed to correspond to a light shielding area of the first substrate 110. The light shielding area may be defined as an area in which the data line DL, the thin film transistor TFT, and the gate line GL are formed. The light shielding area may correspond to the peripheral area SA. Since the pixel electrode PE may not be formed in the light shielding area, liquid crystal molecules in the light shielding area may not be aligned. Thus, a light leakage phenomenon may occur. However, the black matrix BM is disposed in the light shielding area to reduce or prevent the light leakage phenomenon. The black matrix BM may be formed before or after formation of the color filter CF or may be formed concurrently (e.g., simultaneously) with the color filter CF. In an embodiment, a light shielding layer absorbing light may be formed, and the light shielding layer may be patterned using a photolithography process to form the black matrix BM. Alternatively, the black matrix BM may be formed by another method, e.g., an inkjet method.

The color filter CF may be disposed on the second base substrate SUB2 and may provide a color to light passing through the liquid crystal layer LCL. A color layer showing a red color, a green color, a blue color, or another color may be formed on the second base substrate SUB2, and, in an embodiment, the color layer may be patterned using a photolithography process to form the color filter CF. However, the method of forming the color filter CF is not limited thereto. In another embodiment, for example, the color filter CF may be formed by an inkjet method.

In an embodiment, a planarization layer OC may be disposed on the black matrix BM and the color filter CF. The planarization layer OC may planarize the second substrate 120.

A second alignment layer ALN2 may be formed on the planarization layer OC. For example, the second alignment layer ALN2 may be provided to pre-tilt liquid crystal molecules of the liquid crystal layer LCL.

The second alignment layer ALN2 may be formed of a single alignment layer or may include a base alignment layer and an alignment formation layer.

The liquid crystal layer LCL includes a plurality of liquid crystal molecules having dielectric anisotropy. When an electric field is formed between the pixel electrode PE and the common electrode CE of the first substrate 110, the liquid crystal molecules of the liquid crystal layer LCL are rotated to a specific direction between the first substrate 110 and the second substrate 120, and, thus, a transmittance of light inputted into the liquid crystal layer LCL is adjusted.

The spacer CS maintains a distance between the first substrate 110 and the second substrate 120. The spacer CS may absorb an external impact.

A height of the spacer CS may be equal to a cell gap between the first substrate 110 and the second substrate 120. Thus, the spacer CS may be in contact with the first substrate 110 and the second substrate 120. The spacer CS has a function that maintains the cell gap of the display device.

In an embodiment, the spacer CS may be disposed on the first substrate 110. For example, the spacer CS may be disposed on the second insulating layer INL2. In an embodiment, the spacer CS may be disposed on the first alignment layer ALN1 disposed on the second insulating layer INL2.

The spacer CS includes a spacer body portion CS-B and a spacer pattern portion CS-H.

The spacer body portion CS-B may be a pillar-shaped support portion that protrudes from the first substrate 110. In the display device according to an embodiment of the invention, the spacer body portion CS-B has a truncated cone shape. However, embodiments of the invention are not limited thereto. In other embodiments, the spacer body portion CS-B may have any of other various shapes for maintaining the cell gap. For example, the spacer body portion CS-B may have a cylindrical shape, a polygonal prism shape, or a truncated polygonal pyramid shape.

The spacer pattern portion CS-H is disposed on the spacer body portion CS-B. The spacer pattern portion CS-H corresponds to a portion of the spacer CS which is disposed on the spacer body portion CS-B so as to be in contact with the second substrate 120. A further detailed structure of the spacer CS will be described below.

Figure 6:
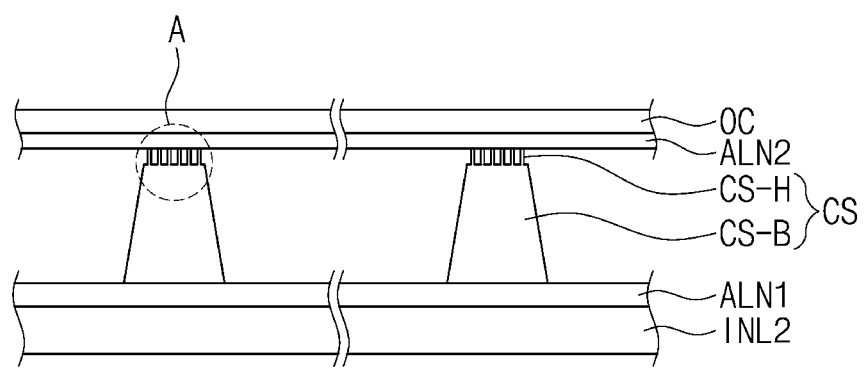
FIG. 6 is a cross-sectional view illustrating a structure of a portion of a display device according to an embodiment of the invention.
Figure 7A:
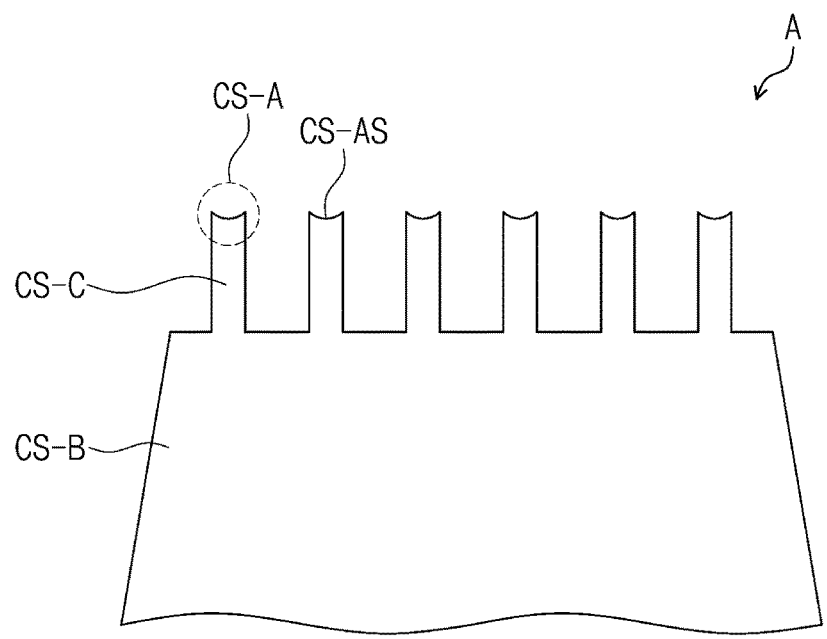
FIGS. 7A to 7C are enlarged cross-sectional views of a region "A" of FIG. 6.
Figure 7B:
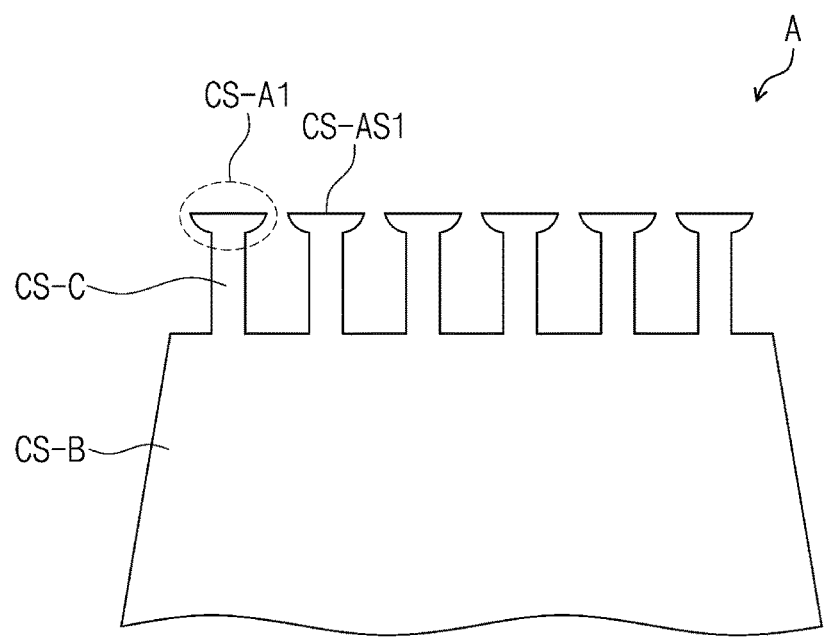
Figure 7C:
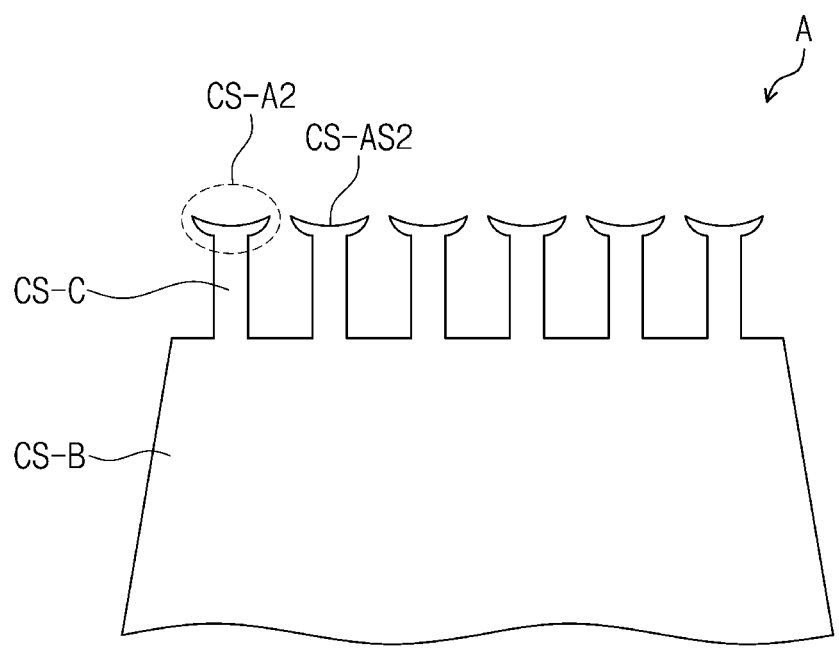
Figure 8:
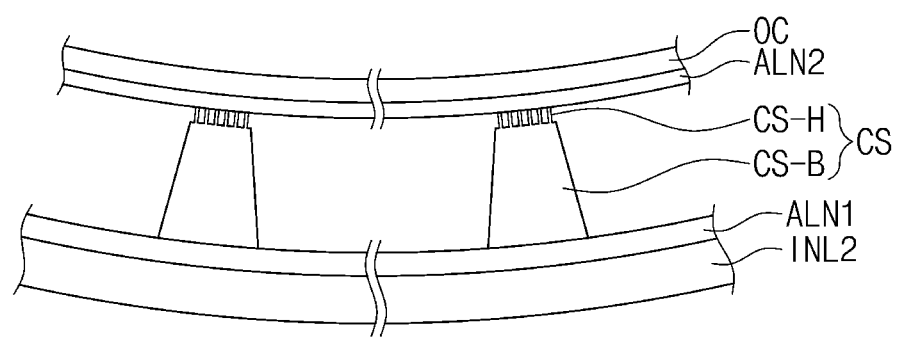
FIG. 8 is a cross-sectional view illustrating a structure of a portion of a display device according to an embodiment of the invention.

FIG. 6 is a cross-sectional view illustrating a structure of a portion of a display device according to an embodiment of the invention. FIGS. 7A to 7C are enlarged cross-sectional views of a region "A" of FIG. 6. FIG. 8 is a cross-sectional view when some components of the display device of FIG. 6 are bent.

Herein, the spacer CS according to the invention will be described in more detail with reference to FIGS. 6, 7A to 7C, and 8.

Referring to FIG. 6, the spacer CS according to an embodiment of the invention is provided in plurality between the first substrate and the second substrate. An appropriate number of the spacers CS for maintaining the cell gap may be disposed between the first and second substrates.

The spacer CS may include a material capable of elastic deformation. In an embodiment, the spacer CS may include a silicon-based polymer compound. For example, the spacer CS may include polydimethylsiloxane (PDMS). However, embodiments of the invention are not limited thereto. In another embodiment, the spacer CS may include carbon nanotube (CNT). In an embodiment, the spacer CS may include any of an organic material, an inorganic material, or an organic/inorganic composite material, which are capable of elastic deformation.

The spacer CS includes the spacer body portion CS-B for substantially uniformly maintaining the cell gap and the spacer pattern portion CS-H for securing adhesive strength with the second substrate.

The spacer body portion CS-B may protrude from the first substrate. In an embodiment, the spacer body portion CS-B may protrude from the first alignment layer ANL1.

The spacer pattern portion CS-H corresponds to a portion of the spacer CS which is disposed on the spacer body portion CS-B so as to be in contact with the second substrate. In the display device according to an embodiment of the invention, the spacer pattern portion CS-H has an adhesive strength (e.g., a predetermined adhesive strength), and, thus, the spacer CS adheres to the second substrate.

Referring to FIGS. 6 and 7A, the spacer pattern portion CS-H includes a plurality of pillar portions CS-C protruding from the spacer body portion CS-B and a plurality of contact portions CS-A disposed on top ends of the plurality of pillar portions CS-C, respectively.

Each of the plurality of contact portions CS-A may include a contact surface CS-AS that is defined at the outermost end (e.g., the uppermost end) of the spacer CS and adheres to a bottom surface of the second substrate. In an embodiment, the contact surface CS-AS may adhere to the second alignment layer ALN2 corresponding to the lowermost component of the second substrate.

In an embodiment, the contact surface CS-AS may be recessed from the outermost end of the spacer CS toward the spacer body portion CS-B. The contact surface CS-AS may have a shape which is concavely recessed from the contact portion CS-A toward the pillar portion CS-C.

In an embodiment, a whole area of the contact surface CS-AS may be greater or wider than a cross-sectional area (e.g., a horizontal cross-sectional area) of the pillar portion CS-C. The cross-sectional area of the pillar portion CS-C may mean an area of a cross-section, cut along a plane parallel to a top surface of the spacer body portion CS-B, of the pillar portion CS-C. In the embodiment of the invention, the contact surface CS-AS may be recessed toward the inside of the pillar portion CS-C, and, thus, the area of the contact surface CS-AS may be larger or wider than the cross-sectional area of the pillar portion CS-C.

Referring to FIGS. 6 and 7B, in a spacer pattern portion CS-H according to an embodiment, a contact portion CS-A1 may be disposed on the pillar portion CS-C and may have a shape of which a diameter becomes progressively greater toward a top end thereof. In an embodiment, the contact portion CS-A1 may have a mushroom shape disposed on the pillar portion CS-C. Here, a contact surface CS-AS1 may be parallel to the top surface of the spacer body portion CS-B and may be flat. Since the contact portion CS-A1 has the shape of which the diameter becomes progressively greater toward the top end thereof, an area of the contact surface CS-AS1 may be greater or wider than the cross-sectional area of the pillar portion CS-C.

Referring to FIGS. 6 and 7C, in a spacer pattern portion CS-H according to an embodiment, a contact portion CS-A2 may have a shape of which a diameter becomes progressively greater from a top end of the pillar portion CS-C toward a top end of the contact portion CS-A2. In addition, a contact surface CS-AS2 of the contact portion CS-A2 may be recessed toward the inside of the pillar portion CS-C. Since the contact portion CS-A2 has the diameter becoming greater toward the top end thereof and the contact surface CS-AS2 is recessed toward the inside of the pillar portion CS-C, an area of the contact surface CS-AS2 may be much greater or wider than the cross-sectional area of the pillar portion CS-C.

The contact portion CS-A according to an embodiment of the invention may have the contact surface CS-AS having a diameter of nanometer(s) or micrometer(s). For example, the area of the contact surface CS-AS may be in a range from several square nanometers ($nm^2$) to several square micrometers ($\mu m^2$).

In an embodiment, the pillar portions CS-C and the contact portions CS-A included in the spacer pattern portion CS-H may be realized by biomimetics using the shape of fine cilia formed on a sole of a gecko and may have the same or similar shapes as the fine cilia formed on the sole of the gecko.

The spacer CS according to an embodiment of the invention may include the spacer pattern portion having an adhesive strength (e.g., a predetermined adhesive strength) to adhere an upper substrate. The spacer pattern portion may be disposed on the spacer body portion and may have a fine ciliated structure which includes the contact surfaces having areas of several square nanometers to several square micrometers. Thus, the spacer pattern portion may adhere to the upper substrate. As described above, the pillar portion and the contact portion of the spacer pattern portion may be realized by the biomimetics using the shape of the fine cilia formed on the sole of the gecko. Due to Van der Waals bonding (force) generated by these shapes of the pillar portion and the contact portion, strong adhesive strength may be generated between the spacer pattern portion and the second substrate. When two atoms approach each other, an electron cloud surrounding each atomic nucleus may fluctuate and a weak electrostatic attractive force may be generated by the fluctuation of the electron cloud. The Van der Waals bonding may mean that the two atoms have bonding strength therebetween by the weak electrostatic attractive force. The spacer according to an embodiment of the invention can have the adhesive strength with the upper substrate by the Van der Waals bonding, and thus the upper substrate and a lower substrate may be fixed without an additional adhesive and misalignment of the display device may be reduced or prevented. In addition, since the additional adhesive is not used, it is possible to prevent the alignment layer of the upper substrate from being damaged by heat generated in an adhesive process using the additional adhesive.

Referring to FIG. 8, even though the display device according to the invention is bent, the spacer CS can be adhered to an original position of the second substrate since the spacer pattern portion CS-H has the adhesive strength (e.g., the predetermined adhesive strength) to adhere to the second alignment layer ALN2 of the second substrate. In an embodiment, since the spacer CS includes an elastic material, such as polydimethylsiloxane (PDMS), the shape of the spacer CS may be changed by the bending of the display device. Thus, it is possible to prevent or substantially prevent the spacer CS from deviating from the original position by deformation of the display device. As a result, the display device according to an embodiment of the invention may prevent or substantially prevent the misalignment between the lower substrate and the upper substrate, which may be caused by the bending of the display device.

A method of fabricating a display device according to an embodiment of the invention will be described herein.

Figure 9:
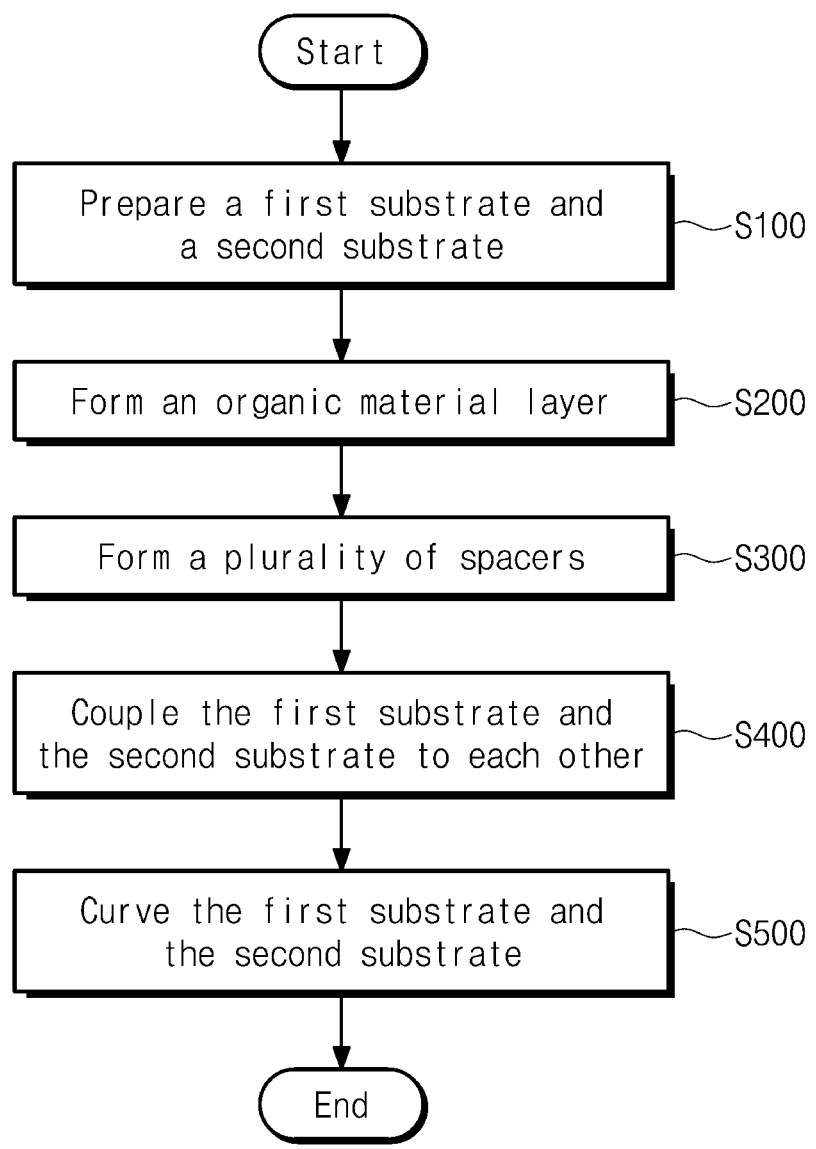
FIG. 9 is a flowchart illustrating a method of fabricating a display device, according to an embodiment of the invention.
Figure 10A:
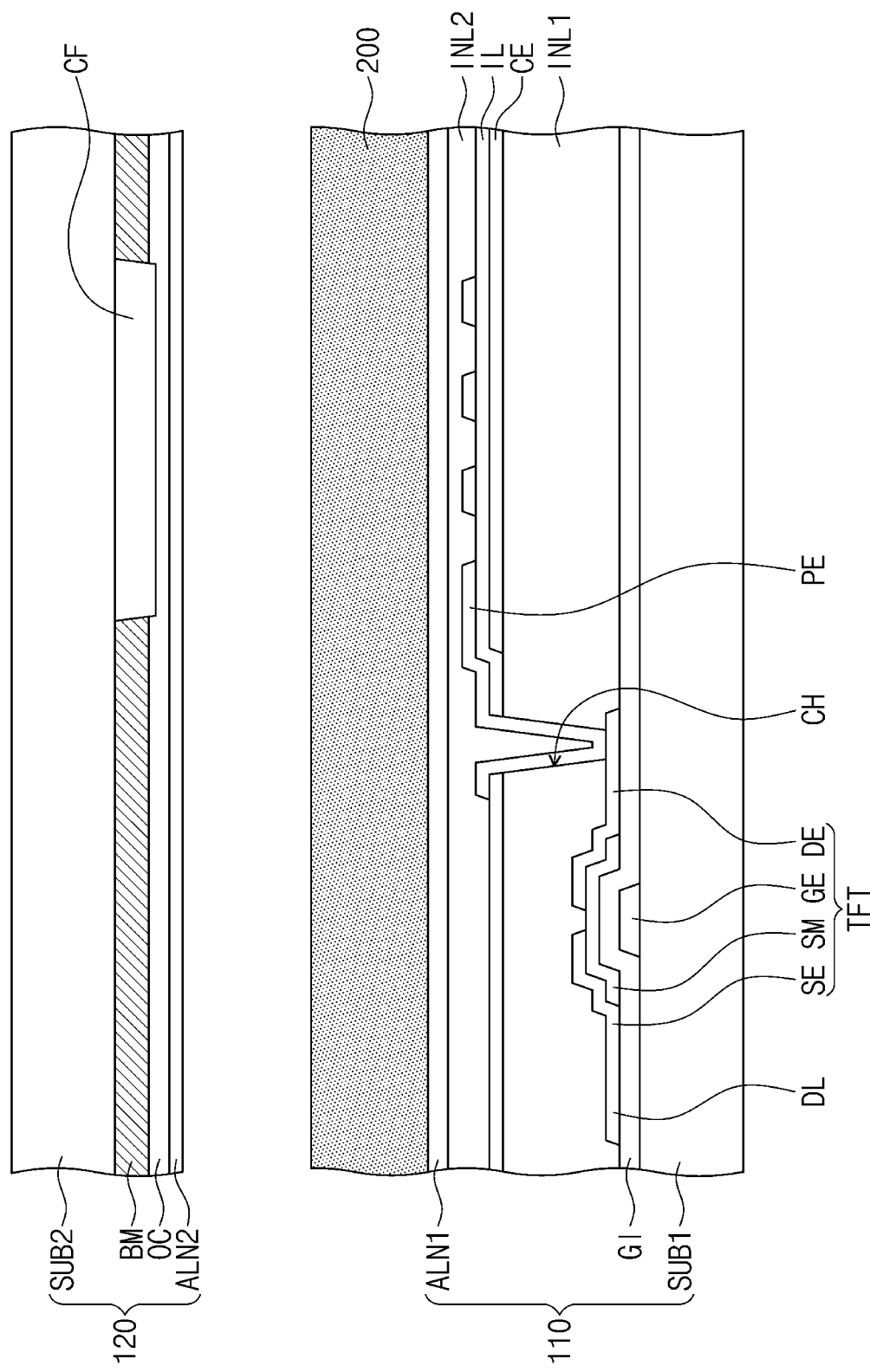
FIGS. 10A to 10C are cross-sectional views illustrating a method of fabricating a display device, according to an embodiment of the invention.
Figure 10B:
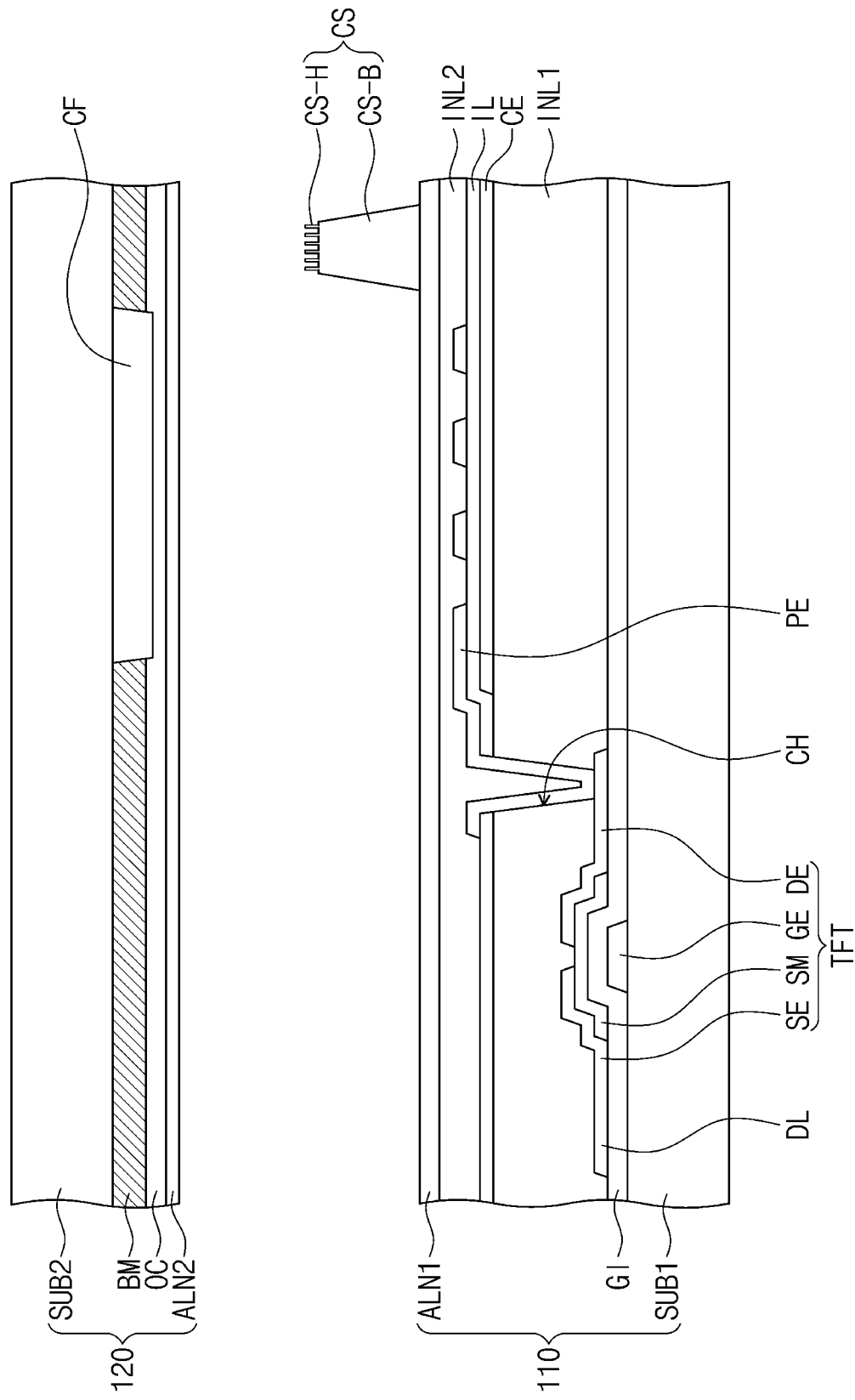
Figure 10C:
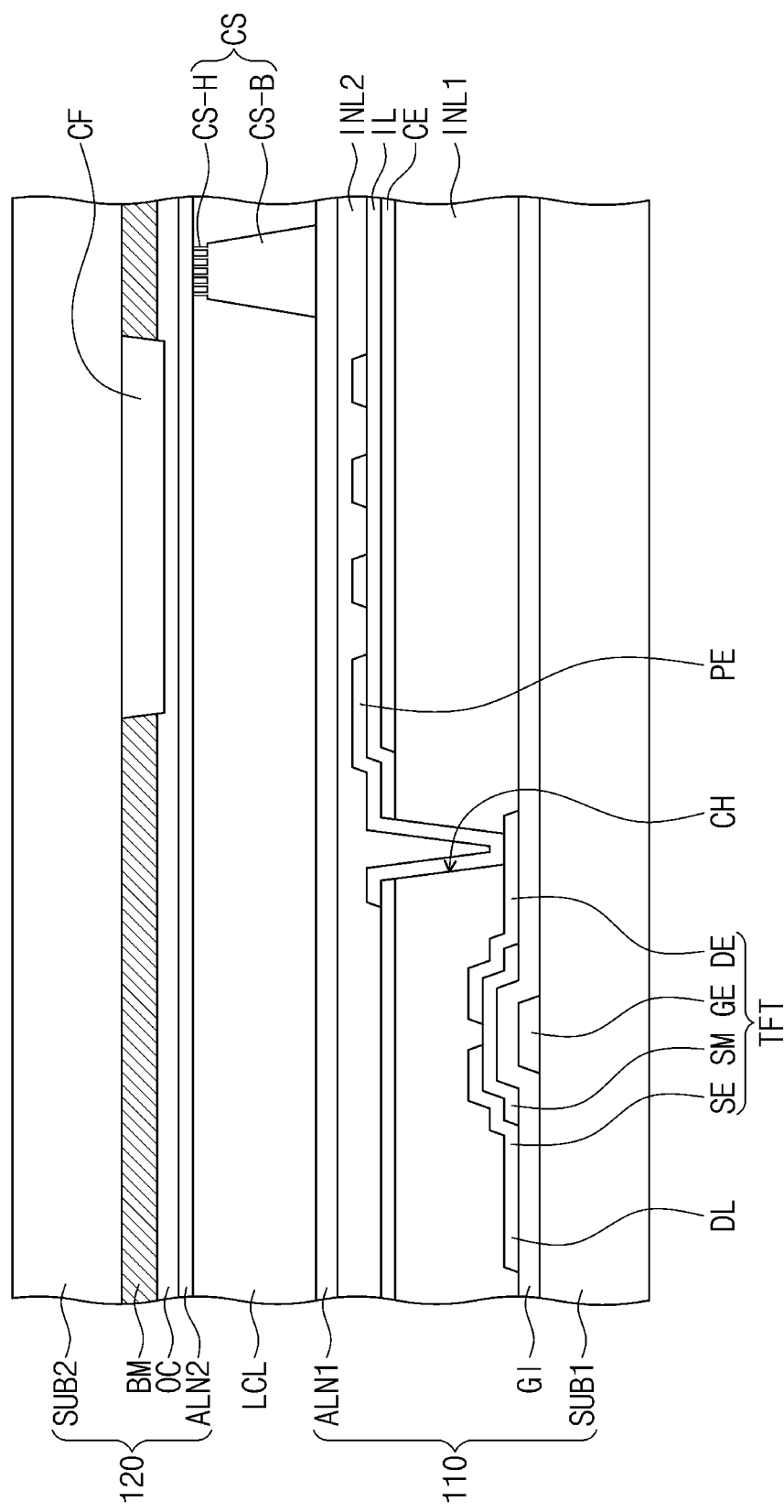

FIG. 9 is a flowchart illustrating a method of fabricating a display device, according to an embodiment of the invention. FIGS. 10A to 10C are cross-sectional views illustrating a method of fabricating a display device, according to an embodiment of the invention. Herein, a method of fabricating a display device according to an embodiment of the invention will be described with reference to FIGS. 9 and 10A to 10C. Herein, the same components as described with reference to FIG. 5 will be indicated by the same reference designators, and repeated descriptions thereof will be omitted.

Referring to FIGS. 9 and 10A, a method of fabricating a display device according to an embodiment of the invention includes preparing a first substrate 110 and a second substrate 120 (S100) and forming an organic material layer 200 on the first substrate 110 (S200).

The first substrate 110 may be a pixel substrate on which a thin film transistor TFT and a capacitor are disposed. The second substrate 120 may be an opposite substrate on which a color filter CF and a black matrix BM are disposed. However, embodiments of the invention are not limited thereto. In other embodiments, components of the first and second substrates 110 and 120 may be variously changed as necessary. For example, in another embodiment, the color filter CF and the black matrix BM may be disposed on the first substrate 110.

The method of fabricating the display device includes forming the organic material layer 200 by coating a top surface of the first substrate 110 with an organic material. In an embodiment, the organic material may be a material that is capable of elastic deformation when it is hardened. For example, the organic material may include a silicon-based polymer compound. In an embodiment, the organic material may include polydimethylsiloxane (PDMS).

Referring to FIGS. 9 and 10B, the method of fabricating the display device includes forming a plurality of spacers CS by patterning the organic material layer 200 (S300).

The spacer CS includes a spacer body portion CS-B and a spacer pattern portion CS-H. In the formation of the spacer CS, the organic material layer 200 may be patterned to form the spacer body portion CS-B, and an upper portion of the spacer body portion CS-B may be patterned to form the spacer pattern portion CS-H. The formation of the spacer CS will be described later in more detail.

Referring to FIGS. 9 and 10C, the method of fabricating the display device includes coupling the first substrate 110 and the second substrate 120 to each other (S400).

The first substrate 110 and the second substrate 120 may be coupled to each other with the plurality of spacers CS interposed therebetween. At this time, the spacer pattern portion CS-H having an adhesive strength (e.g., a predetermined adhesive strength) may be formed at an upper portion of the spacer CS, and, thus, the spacer CS may adhere to the second substrate 120. In an embodiment, the spacer CS may adhere to the second alignment layer ALN2 included in the second substrate 120.

In the method of fabricating the display device, each of the first and second substrates 110 and 120 may be fabricated, the first and second substrates 110 and 120 may be coupled to each other to define a cell gap, and a liquid crystal material may be injected into the cell gap to fabricate a liquid crystal layer LCL. Alternatively, the liquid crystal material may be located on a surface of one of the first and second substrates 110 and 120, and the first and second substrates 110 and 120 may be coupled to each other with the liquid crystal material interposed therebetween, thereby fabricating the liquid crystal layer LCL.

The method of fabricating the display device according to an embodiment of the invention may further include curving (or bending) the first substrate 110 and the second substrate 120 by applying an external force to the first and second substrates 110 and 120 (S500). Thus, the display device fabricated by the fabricating method according to the invention may be the display device curved along the first direction D1 (see FIG. 1).

FIGS. 11A to 11G are cross-sectional views illustrating some processes of a method of fabricating a display device, according to an embodiment of the invention. The method of forming the spacer CS in the method of fabricating the display device according to an embodiment of the invention will be described herein in more detail.

Figure 11A:
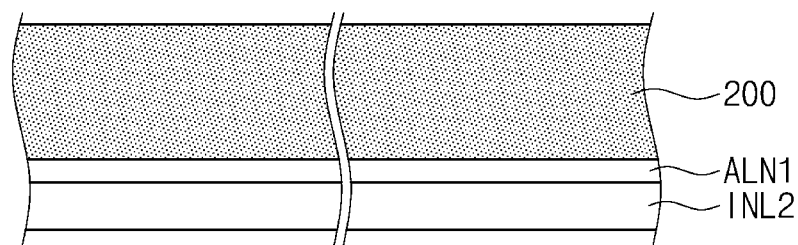
FIGS. 11A to 11G are cross-sectional views illustrating some processes of a method of fabricating a display device, according to an embodiment of the invention.

Referring to FIG. 11A, the organic material layer 200 is formed on the first substrate. In an embodiment, the organic material layer 200 may be formed on the first alignment layer ALN1 corresponding to the uppermost layer of the first substrate.

Figure 11B:
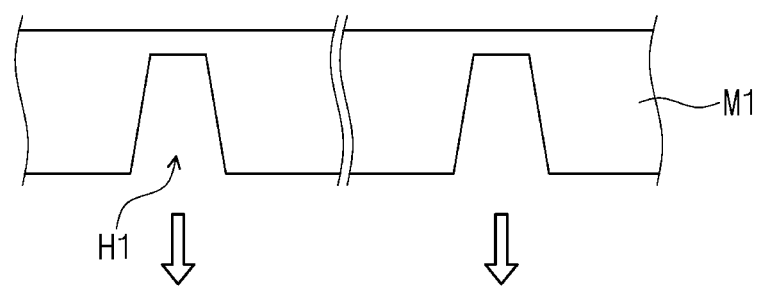
Figure 11B:
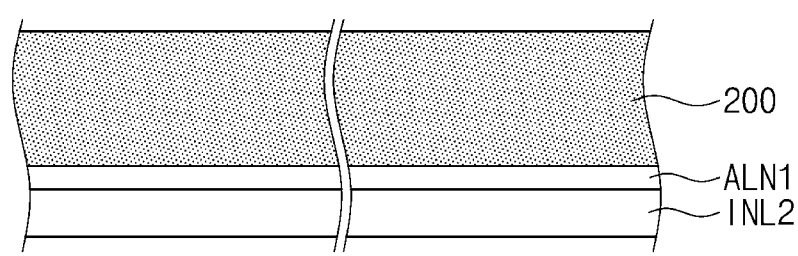
Figure 11C:
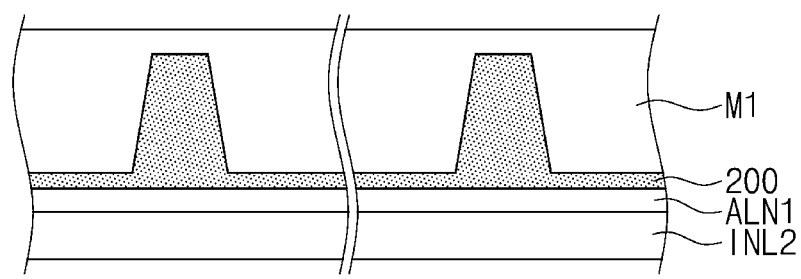

Referring to FIGS. 11B and 11C, the method of forming the spacer according to an embodiment of the invention may include pressing the organic material layer 200 by using a first mold M1. A first recess H1 may be defined in the first mold M1. The first recess H1 may have a shape that corresponds to the shape of the spacer body portion CS-B (see FIG. 6). A depth (or a height) of the first recess H1 may be greater than the height of the spacer body portion CS-B. Since the organic material layer 200 is pressed by the first mold M1 having the first recess H1, the organic material included in the organic material layer 200 may be moved into the first recess H1 to form an organic pattern corresponding to the shape of the spacer body portion CS-B. In FIG. 11C, a portion of the organic material layer 200 which is not moved into the first recess H1 may be maintained as a flat layer. However, embodiments of the invention are not limited thereto. In certain embodiments, the flat layer may not be formed, as illustrated in FIG. 6.

Figure 11D:
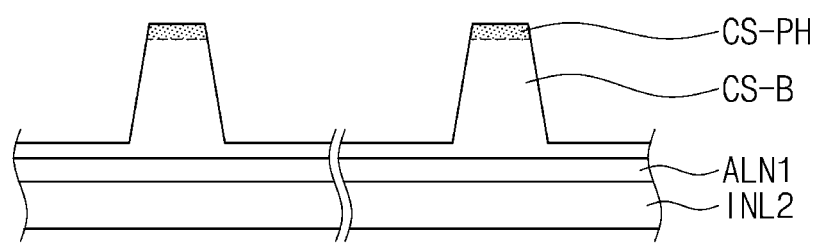

Referring to FIGS. 11C and 11D, the method of forming the spacer according to an embodiment of the invention may include partially hardening the organic material layer 200 pressed by the first mold M1. In an embodiment, the hardening of the organic material layer 200 may include a heat curing process or a light curing process.

In the hardening of the organic material layer 200, the formed organic pattern may not be completely hardened but may be partially hardened. In other words, in the hardening, an upper portion of the organic pattern may not be hardened, and a lower portion of the organic pattern except the upper portion may be hardened. Thus, the hardened lower portion may form the spacer body portion CS-B, and the organic material may remain in an unhardened state in an unhardened upper pattern CS-PH.

Figure 11E:
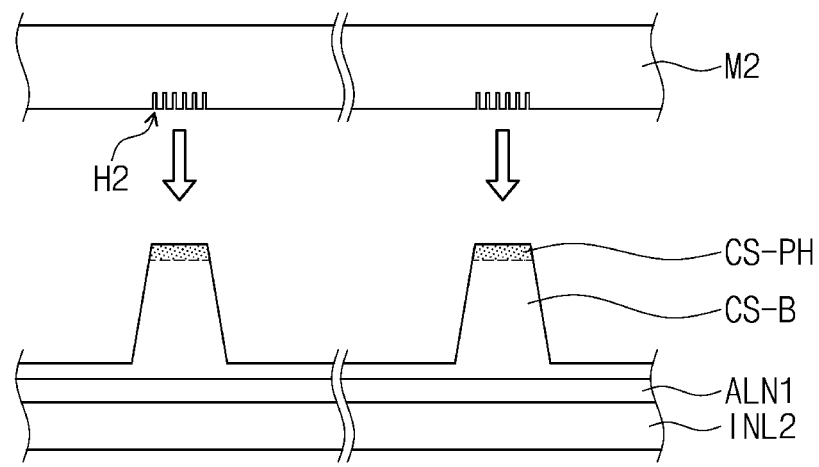
Figure 11F:
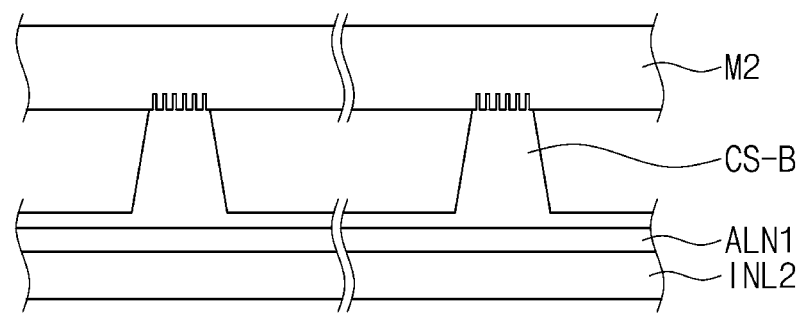

Referring to FIGS. 11E and 11F, the method of forming the spacer according to an embodiment of the invention may include pressing the unhardened upper pattern CS-PH by using a second mold M2. A second recess H2 may be defined in the second mold M2. The second recess H2 may have a shape that corresponds to the shape of the spacer pattern portion CS-H formed on the spacer body portion CS-B. In an embodiment, the second recess H2 may have a shape that corresponds to the shapes of the plurality of pillar portions CS-C (see FIG. 7A) and the shapes of the plurality of contact portions CS-A (see FIG. 7A) formed on the spacer body portion CS-B. The second recess H2 may have any of various shapes corresponding to the shapes of the plurality of pillar portions and the shapes of the plurality of contact portions.

Figure 11G:
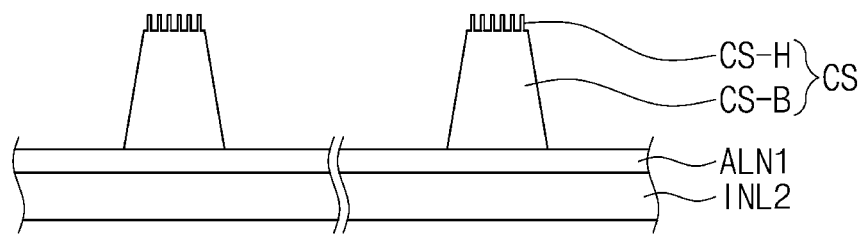

Referring to FIGS. 11F and 11G, the pressed unhardened upper pattern CS-PH may be hardened to form the spacer pattern portion CS-H. The spacer pattern portion CS-H may include the plurality of pillar portions and the plurality of contact portions.

In the method of fabricating the display device according to an embodiment of the invention, the spacer may be formed by two imprinting processes. In other words, the spacer body portion may be formed through a first imprinting process, and the spacer pattern portion may be formed at the upper portion of the spacer body portion through a second imprinting process. In the method of fabricating the display device according to an embodiment of the invention, the spacer may be formed by the imprinting processes, and thus the fabricating processes may be simplified and a material required in the processes may be reduced to reduce a fabrication cost of the display device. In addition, the spacer having the adhesive strength with the upper substrate may be formed by the simple process.

The display device according to embodiments of the present invention may prevent or substantially prevent misalignment from occurring between the upper substrate and the lower substrate by bending or curving of the display device.

The method of fabricating the display device according to embodiments of the present invention may simplify the fabricating processes and may reduce an amount of the required material to reduce the fabrication cost of the display device.

While the invention has been described with reference to some example embodiments, it will be apparent to those skilled in the art that various changes and modifications may be made without departing from the spirit and scope of the invention. Therefore, it should be understood that the above-described embodiments are not limiting, but illustrative. Thus, the scope of the invention is to be determined by the broadest permissible interpretation of the following claims and their equivalents, and shall not be restricted or limited by the foregoing description.

What is claimed is:

1. A display device comprising:
    a first substrate;
    a second substrate opposite to the first substrate;
    a liquid crystal layer between the first substrate and the second substrate; and
    a plurality of spacers maintaining a cell gap between the first substrate and the second substrate,
    wherein each of the plurality of spacers comprises:
    a spacer body portion protruding from the first substrate; and
    a spacer pattern portion integrally formed with the spacer body portion and comprising: a plurality of pillar portions protruding from the spacer body portion; and a plurality of contact portions respectively on top ends of the plurality of pillar portions, each of the plurality of contact portions comprising a contact surface in direct contact with a bottom surface of the second substrate,
    wherein the contact surface of each of the plurality of contact portions is defined at an outermost end of a respective spacer of the spacers to adhere to the bottom surface of the second substrate, and
    wherein an area of the contact surface is greater than a cross-sectional area of a cross-section, which is parallel to a top surface of the spacer body portion, of a respective pillar portion of the pillar portions.

2. The display device of claim 1, wherein the contact surface is recessed from the outermost end of the respective spacer toward the spacer body portion.

3. The display device of claim 1, wherein the contact surface is parallel to a top surface of the spacer body portion and is flat.

4. The display device of claim 1, wherein a diameter of each of the contact portions becomes progressively greater from a respective pillar portion of the pillar portions toward a top end of each of the contact portions.

5. The display device of claim 1, wherein the spacers comprise a material capable of elastic deformation.

6. The display device of claim 5, wherein the spacers comprise a silicon-based polymer compound.

7. The display device of claim 6, wherein the spacers comprise polydimethylsiloxane.

8. The display device of claim 1, wherein the first substrate and the second substrate are curved along a direction.

9. A display device comprising:
   a display substrate which is curved along a direction and on which a pixel is arranged;
   an opposite substrate that is opposite to the display substrate and is coupled to the display substrate so as to be curved along the direction; and
   a plurality of spacers maintaining a distance between the display substrate and the opposite substrate,
   wherein each of the plurality of spacers comprises:
   a spacer body portion protruding from the display substrate;
   a plurality of pillar portions integrally formed with the spacer body portion and protruding from the spacer body portion; and
   a plurality of contact portions on top ends of the plurality of pillar portions, respectively, each of the plurality of contact portions comprising a contact surface in direct contact with a bottom surface of the opposite substrate,
   wherein the contact surface of each of the plurality of contact portions is defined at an outermost end of a respective spacer of the spacers to adhere to the bottom surface of the opposite substrate, and
   wherein an area of the contact surface is greater than a cross-sectional area of a cross-section, which is parallel to a top surface of the spacer body portion, of a respective pillar portion of the pillar portions.

10. The display device of claim 9, wherein the contact surface is recessed from a top end of the respective spacer toward the spacer body portion.

11. A method of fabricating a display device, the method comprising:
    preparing a first substrate including a pixel and a second substrate opposite to the first substrate;
    forming an organic material layer on the first substrate;
    forming a plurality of spacers by patterning the organic material layer; and
    coupling the first substrate and the second substrate to each other with a liquid crystal layer and the plurality of spacers therebetween such that the first substrate and the second substrate face each other, the plurality of spacers maintaining a cell gap between the first substrate and the second substrate,
    wherein the forming of the plurality of spacers comprises:
    patterning the organic material layer to form a spacer body portion protruding from the first substrate; and
    patterning an upper portion of the spacer body portion to form a plurality of pillar portions integrally formed with the spacer body portion and protruding from the spacer body portion and a plurality of contact portions respectively on top ends of the plurality of pillar portions, each of the plurality of contact portions comprising a contact surface,
    wherein the first substrate and the second substrate are coupled to each other such that the contact surfaces are in direct contact with a bottom surface of the second substrate,
    wherein the contact surface of each of the plurality of contact portions is defined at an outermost end of a respective spacer of the spacers to adhere to the bottom surface of the second substrate, and
    wherein an area of the contact surface is greater than a cross-sectional area of a cross-section, which is parallel to a top surface of the spacer body portion, of a respective pillar portion of the pillar portions.

12. The method of claim 11, wherein the organic material layer comprises a silicon-based polymer compound.

13. The method of claim 12, wherein the organic material layer comprises polydimethylsiloxane.

14. The method of claim 11, wherein the forming of the plurality of spacers further comprises:
    pressing the organic material layer using a first mold in which a first recess corresponding to a shape of the spacer body portion is defined;
    partially hardening the pressed organic material layer to form the spacer body portion;
    pressing the upper portion of the spacer body portion using a second mold in which a second recess corresponding to shapes of the plurality of pillar portions and the plurality of contact portions is defined; and
    hardening the pressed upper portion of the spacer body portion to form the plurality of pillar portions and the plurality of contact portions.

15. The method of claim 11, further comprising curving the first substrate and the second substrate along a direction by applying an external force to the first substrate and the second substrate.

* * * * *